United States Patent [19]

Bartelink

[11] Patent Number: 5,077,598
[45] Date of Patent: Dec. 31, 1991

[54] STRAIN RELIEF FLIP-CHIP INTEGRATED CIRCUIT ASSEMBLY WITH TEST FIXTURING

[75] Inventor: Dirk J. Bartelink, Los Altos Hills, Calif.

[73] Assignee: Hewlett-Packard Company, Palo Alto, Calif.

[21] Appl. No.: 433,485

[22] Filed: Nov. 8, 1989

[51] Int. Cl.$^5$ ............... H01L 23/48; H01L 29/44; H01L 23/36; H01L 29/52

[52] U.S. Cl. .................... 357/68; 357/79; 361/428

[58] Field of Search ............ 357/79, 68, 65; 361/408

[56] References Cited

U.S. PATENT DOCUMENTS

| | | | |
|---|---|---|---|
| 3,030,558 | 4/1962 | Berg et al. | 357/79 |
| 3,596,228 | 5/1969 | Reed | 339/59 |
| 4,070,688 | 1/1978 | Wislocky | 357/68 |
| 4,215,359 | 7/1980 | Schermer et al. | 357/70 |
| 4,647,959 | 3/1987 | Smith | 357/74 |
| 4,710,798 | 12/1987 | Marcantonio | 357/80 |
| 4,845,542 | 7/1989 | Bezuk et al. | 357/68 |
| 4,871,921 | 10/1989 | Gurnee | 250/578 |
| 4,893,172 | 1/1990 | Matsumoto et al. | 357/79 |

FOREIGN PATENT DOCUMENTS

3129568 4/1982 Fed. Rep. of Germany .

OTHER PUBLICATIONS

'Areal Contacting of Chips to Modules', IBM Tech., vol. 30, #4, Sep. 87, p. 1604.
Ho–Ming Tong et al. in "Ceramic Packages For Liquid–Nitrogen Operation", IEEE Transactions on Electron Devices, vol. ED-36, No. 8, Aug. '89, pp. 1521-1527.
Kurt E. Peterson, "Dynamic Micromechanics on Silicon; Techniques and Devices", vol. ED-25, No. 10, Oct. '87, pp. 1241-1250.
Lasky et al., "Silicon–On–Insulator (SOI) By Bonding and Etch-Back", International Electron Devices Meeting, 1985, pp. 684-687.
Ernest Levine and J. Ordonez in "Analysis of Thermal Cycle Fatigue Damage in Microsocket Solder Joints", IEE Transactions On Components, Hybrids and Manufacturing Technology, vol. CHMT-4, No. 4, Dec. 1981, pp. 515, 519.
Fumio Nakano, Tasao Soga and Shigeo Amagi, Hitachi Research Laboratory, "Resin–Insertion Effect on Thermal Cycle Resistivity of Flip-Chip Mounted LSI Devices", ISHM '87 Proceedings, p. 536.

*Primary Examiner*—Andrew J. James
*Assistant Examiner*—Stephen D. Meier

[57] ABSTRACT

A multi-chip, self-aligning, integrated circuit flip-chip assembly using flexible connection assemblies for its attachment is enclosed in an integrated circuit package. The connection assembly contains connection pillars which are attached to a die and a carrier wafer by means of flexible membranes covering cavities in the respective components. Each pillar consists of two opposing connection posts, of die and carrier wafer, joined by a solder bump. A post is formed by etching a ring into the dielectric around predefined metal islands provided by the process, which are interconnected by respective vias to form a conductive core. The conductive path established between first layer metal interconnects of mating components via the connection pillars furnishes the electrical interface between chip and carrier in the flip chip arrangement. Flexure of the membranes allowed by the air filled cavities enables the connection pillars to tilt, so as to relieve the assembly of shear strain when subjected to differential thermal expansion. A membrane prober, using test metal bumps in place of solder joints but which is otherwise identical to the flip-chip assembly, can be interfaced with a tester to perform conventional vector testing of individual chips or complete multi-chip assemblies. Alternatively, test assemblies with metal bumps can be configured as "system-emulators" for testing individual production chips, by providing a test environment that accurately represents the full system. This test method dispenses with the many technical drawbacks and high costs associated with conventional vector testing, including the loading by the low tester impedance.

3 Claims, 5 Drawing Sheets

STRAIN RELIEF FLIP-CHIP INTEGRATED CIRCUIT ASSEMBLY WITH TEST FIXTURING

BACKGROUND OF THE INVENTION

The present invention relates to integrated circuits and, more specifically, to an improved chip-to-carrier attachment method. A prime objective of this invention is to furnish high-density multi-chip assemblies with superior reliability.

Integrated circuits are used in most all categories of technological products embracing both commercial and military applications. Implementation of the advanced technology segment in this product spectrum requires both high-density and high-performance systems. Their realization necessitates high-density integrated circuit chips and a compact packaging technology.

Chip circuit density is afforded by advanced integrated circuit process technology, whereas compact packaging is achieved by multi-chip assemblies. While multi-chip carriers have been fabricated using various technologies, the highest chip density has been attained by fabricating carriers with the same process technology used to make the chips. The resulting density substantially exceeds that obtained with printed circuit boards carrying single chip packages.

Improved density provided by a multi-chip carrier environment results in shorter interconnection lengths between adjacent chips and, therefore, better performance. On the other hand, the size of single chip packages, which limits chip placement density, is characterized by longer interconnections and thereby poorer performance.

Furthermore, multi-chip assemblies provide for combining generic technologies such as analog, digital, bipolar and CMOS instead of using the more costly mixed technology chips, e.g., Analog/Digital and BiCMOS. For example, a multi-chip package using separate digital and analog chips combines simpler technologies with better individual yields. This results in highly functional cost-effective systems.

Among the chip mounting techniques the "flip-chip" method provides superior functional density since signal and power interfacing is no longer limited to the periphery of the chip. System density is further increased by accommodation of active circuits on the multi-chip carrier.

"Flip-chip" mounting involves turning the chips upside down for direct attachment to the opposing multi-chip carrier. The final assembly requires a reliable attachment method as well as precise alignment of the components. A conventional attachment technique joins opposing contact areas using solder bumps. The relatively new self-alignment technique, which is discussed in U.S. patent application Ser. No. 295,729, uses pin blocks which mate with chip slots and carrier apertures. It allows for precise, convenient and repeatable alignment which facilitates assembly and testing.

Testing of multi-chip assemblies is of equal importance to reliable attachment and alignment methods. A test assembly, using test bumps in place of solder joints to connect chips and carrier, can be either interfaced with a tester or serve as a "system-emulator". The latter concept was introduced as "substitution testing" in the above patent application. This "in-system" test environment has a significant advantage over conventional test set-ups, by accurately representing the multi-chip system and thereby avoiding the need for vector testing, transmission line driving and ESD circuits, etc. In addition it features simplicity and efficiency. Furthermore, the substantial costs of test development and associated hardware, which rapidly increase for testing of more complex systems, are also saved.

Solder bumps incur a reliability problem due to the shear strain produced by differential thermal expansion between chips and carrier. This is caused either by a material mismatch or simply a temperature difference between assembly components made of the same materials. Results of solder bump reliability studies have been reported by Ernest Levine and J. Ordonez in "Analysis of Thermal Cycle Fatigue Damage in Microsocket Solder Joints", IEEE *Transactions on Components, Hybrids and Manufacturing Technology*, Vol. CHMT-4, No. 4, December 1981, pp. 515–519; and by Fumio Nakano, Tasao Soga and Shigeo Amagi, Hitachi Research Laboratory-Hitachi Ltd. Hitachi, Ibaraki 319-12 Japan, in "Resin-Insertion Effect on Thermal Cycle Resistivity of Flip-Chip Mounted LSI Devices", ISHM '87 Proceedings, pp. 536.

More recently, these studies have been extended to low temperature operation and their results reported by Ho-Ming Tong et al. in "Ceramic Packages for Liquid-Nitrogen Operation", *IEEE Transactions on Electron Devices*, Vol. ED-36 No. 8, August 1989, pp. 1521–27. Solder joints develop fatigue during temperature cycling until failures occur. Their use is thus subject to deterioration and limited lifetime.

Failure of solder joints in flip-chip assemblies gave the impetus to look for alternative chip-to-carrier attachment methods. One such method proposes gold bumps as chip terminals contacting gold pads attached to flexible membranes on the carrier. Under differential thermal expansion between chip and carrier, the bumps are free to move due to the flexibility of the membranes. This approach avoids the rigidity of permanent solder bump joints. It also assures electrical contact of all mating pairs despite lack of parallelism in opposing surfaces of chip and carrier. This is accomplished since the resulting differential spacings between mating contact pairs are compensated by differential depressions of corresponding membranes through application of pressure during assembly.

The gold bump attachment method features high connection density, chip demountability, substitution testing and remains reliable during differential thermal expansion. Here the gold bumps can be made reasonably small since the carrier uses a single layer metal system. However, if a multi-layer metal system is employed the overall size of the gold bumps is increased to enable them to clear the upper interconnection layers when reaching down to the membranes and maintain sturdiness at the same time. The resulting lower connection density, uneven chip surface, as well as the fact that gold is an unconventional metallization for mass produced integrated circuits makes this attachment method less attractive for very large scale integration (VLSI) circuits.

It follows then that a different attachment method for multichip assemblies is needed which is applicable to VLSI circuits using multi-layer metal structures. The attachment method should furnish a reliable interface which is maintained during differential thermal expansion. Preferably the attachment structure should be fabricated employing conventional IC processing techniques used for chips and carrier.

SUMMARY OF THE INVENTION

In accordance with the present invention, a "flip-chip" integrated circuit assembly is fabricated using flexibly attached connection pillars to electrically and mechanically attach chips and carrier. These contain pillars and flexible joints for attaching the pillars with chips and carrier. The pillars space chips from carrier in the axial direction, defined by the axes of the pillars. Each pillar uses at least one flexible joint for attaching with either chip or carrier, and can move in its axial direction and tilt with respect to it. When the assembly is subjected to differential thermal expansion between chip and carrier, the resulting movement of the pillars reduces the shear strain in planes orthogonal to and along their axial direction.

Connection pillars and their methods of attachment to assembly components can be realized using a variety of structures. For example, a pillar can be attached to a chip and a carrier using flexible joints at both ends. In an alternative arrangement a pillar comprises two posts joined by a solder bump where at least one post uses a flexible connection to attach it to one of the assembly components. In a second alternative pillar attachments use at least one flexible joint, which consists of a flexible membrane formed over a cavity.

In a preferred arrangement, the connection pillar comprises two opposing connection posts joined by a solder bump, each of which has a flexible joint with either chip or carrier. Each post is made of dielectric material with an inner conductive core formed by a vertically interconnected structure of all metal layers provided by the process. The uppermost metal contacts the solder bump, whereas the bottom one and the dielectric are attached to a flexible membrane. Consequently, the connection pillar, which features a rigid construction, can flex as a unified member with the associated membranes. When the flip-chip assembly is subjected to differential thermal expansion the flexure of the connection pillar assembly exhibits three degrees of freedom. Therefore the shear strain, normally occurring in solder bumps of conventional rigid assemblies, is practically eliminated.

Connection posts are formed by etching rings into the dielectric of the multi-layer metal structures at pre-defined locations. Etching stops at the upper surfaces of the membranes and first layer metal. The inner walls of the rings become outer walls of the posts, whereas the outer walls form holes in the active interconnection areas. Inside each post, pre-defined metal islands from all existing layers are vertically interconnected with vias to form its conductive core. Formation of the connection posts is identical in chips and carrier.

During the assembly process of chip and carrier, the differences in local spacings defined by contact surfaces of opposing posts need to be accommodated. This invention takes advantage of the fact that integrated circuit substrates are substantially optically flat, so that spacing variations introduced by congruent posts across the attachment area can be kept within tight tolerances. When chip and carrier posts are brought together for soldering, these tolerances create differently shaped solder bumps of varying heights across the chip area, so that spacing variations are accommodated. Limit feet distributed across the chip surface set the minimum spacing between chip and carrier.

An assembly tool which is used for mounting opposite components in a flip-chip arrangement first furnishes rough alignment between them under robotic control, in preparation to the subsequent self-alignment mentioned above. Thereafter, the assembly tool maintains pressure of the limit feet against the carrier surface during the soldering phase. At the end of the solidification phase of solder bumps, quiescent conditions of the membranes are established for uniform temperature of chip and carrier. In this state membranes are flat and under minimal initial tension. When power is applied to the chip, its temperature rises with respect to the carrier. The ensuing differential thermal expansion causes the connection pillars to flex resulting in increased tension and deformation of the membranes.

A preferred final package contains the integrated circuit "flip-chip" assembly placed inside a ceramic housing which is covered by a lid. The assembly includes a carrier wafer and two or more dice pressed against pin blocks which register them to the wafer. Carrier terminals are bonded to conductors on the ceramic housing which in turn are connected with the package pins.

The present invention features a new attachment method of a flip-chip assembly which additionally constitutes an environment for convenient testing. Specifically, a "membrane prober" can be made using an almost identical carrier as the one in the integrated circuit assembly, except that metal bumps are used in place of solder joints. Such test assemblies are then interfaced with a tester, allowing for conventional vector testing of both individual chips and multi-chip systems.

In an alternative approach of particular importance a test assembly serves as a "system-emulator" for testing individual production chips. It has the significant advantage of providing a test environment that accurately represents the full system, and saves the ever increasing costs of test development and hardware associated with the test of complex systems.

This "substitution testing" avoids the many drawbacks incurred when testing packaged chips on a tester. For example, large power transistors required to drive low impedance transmission lines, connecting chip and tester, are no longer required. Instead of testing the chip with test-vectors supplied by a tester, "structured testing" by means of testability circuits resident on the carrier wafer affords "in-system" testing. This reduces the number of test access pins which either interface with a tester or the test-hierarchy of an incorporating system. Furthermore, mixed technology chips are easily tested in this environment since their individual technology is transparent to the test pins. Another advantage is the exclusion of electrostatic protection circuits from the chips, since the latter can be mounted onto the test assembly in the factory where proper humidity conditions exist.

The described "flip-chip" assembly combines the advantages of flexible attachment through connection pillars and conventional solder bump technology. Due to the flexible attachment of its components, the assembly is relieved of strain during differential thermal expansion, whereby its reliability is enhanced. Furthermore, connection pillars are processed as an integral part of the die, saving some of the additional process steps and cost overhead associated with alternative structures implemented by multilevel interconnect fabrication. The new flip-chip assembly features high chip density, compactness, high performance, ease of testing and superior reliability, which constitutes an improvement over conventional assemblies. These and other features and advantages of the present invention are apparent in the description below with reference to the following drawings.

In the figures, a component, element, or step referenced by a three digit number has as its first digit the figure number in which it was introduced. For example, carrier wafer 102 is first shown in FIG. 1 and pinblocks 236 are first shown in FIG. 2. This is intended to aid the reader in locating a referent when it is not shown in the figure to which a given portion of the following description is referring explicitly.

DESCRIPTION OF THE PREFERRED EMBODIMENTS

Figure 1:
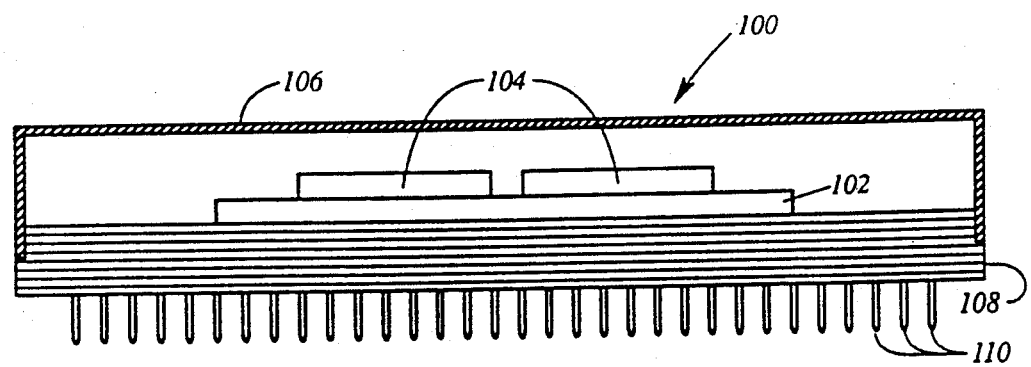
FIG. 1 is a sectional view of an integrated circuit package which contains a multi-chip integrated circuit assembly in accordance with the present invention.

In accordance with the present invention, a multiple integrated circuit package 100 contains a carrier wafer 102, two integrated circuit (IC) dice 104, a ceramic housing 108 and a package lid 106, as shown in FIG. 1. IC chips 104 contain most or all of the circuits performing the system function assigned to package 100, whereas carrier 102 contains some or none of the interface circuits and all system interconnections including conductive paths to pins 110. Pins 110 provide the interface of package 100 to an incorporating system.

Figure 2:
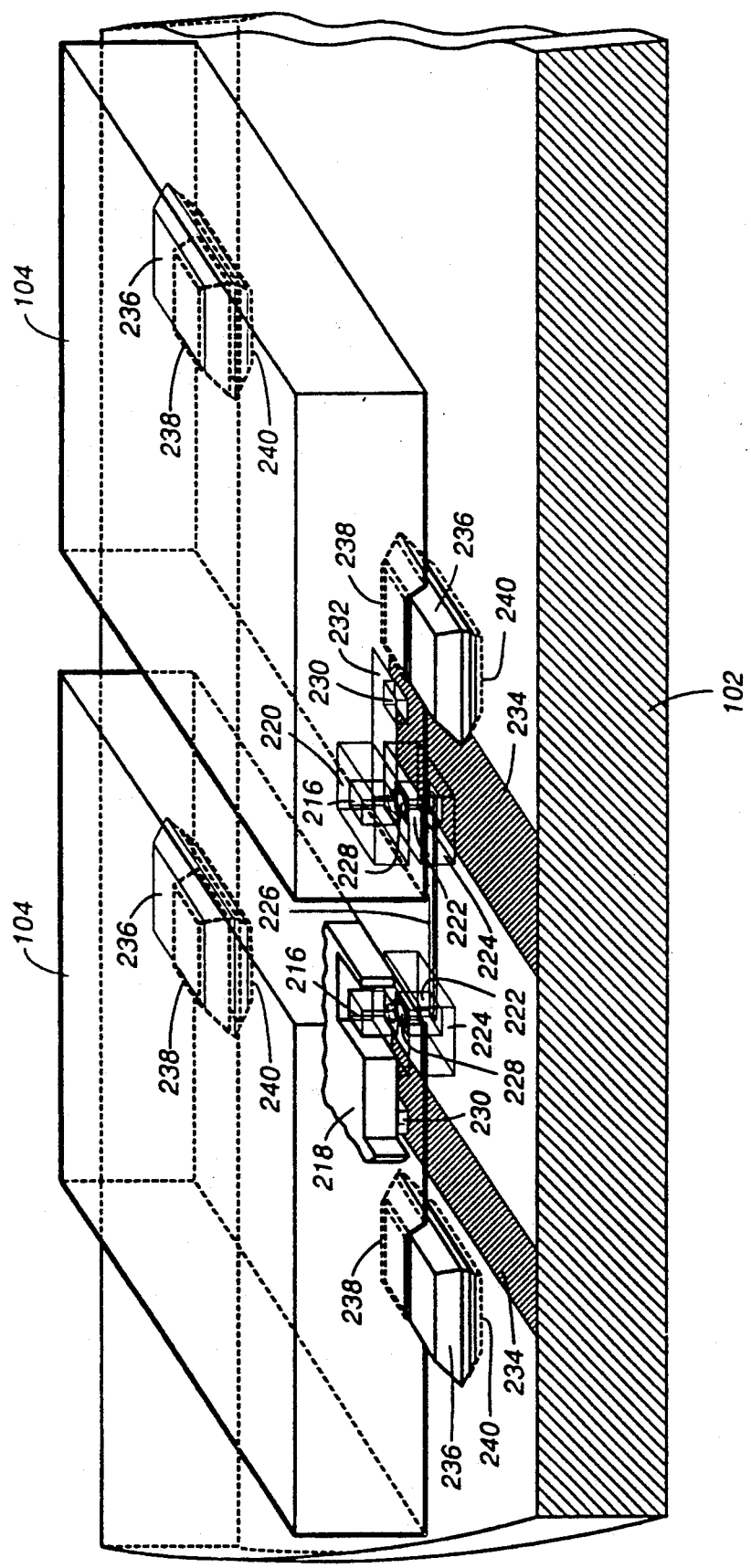
FIG. 2 is a detailed view of the multi-chip assembly shown in FIG. 1.

Accurate final alignment of IC dice 104 in the XY plane of carrier wafer 102 is provided by pin blocks 236 which mate apertures 240 in carrier wafer 102 with slots 238 in dice 104, as shown in FIG. 2. Initial chip to carrier misalignment during assembly is automatically corrected by engagement of pin blocks with apertures and slots through application of pressure by an assembly tool under robotic control. This correction process is defined as "self-alignment", which allows for precise registration between chips and carrier. Carrier wafer 102, pin blocks 236 and IC dice 104 collectively constitute a self aligned IC flip-chip assembly 300, as shown in FIGS. 2 and 3A.

Figure 3B:
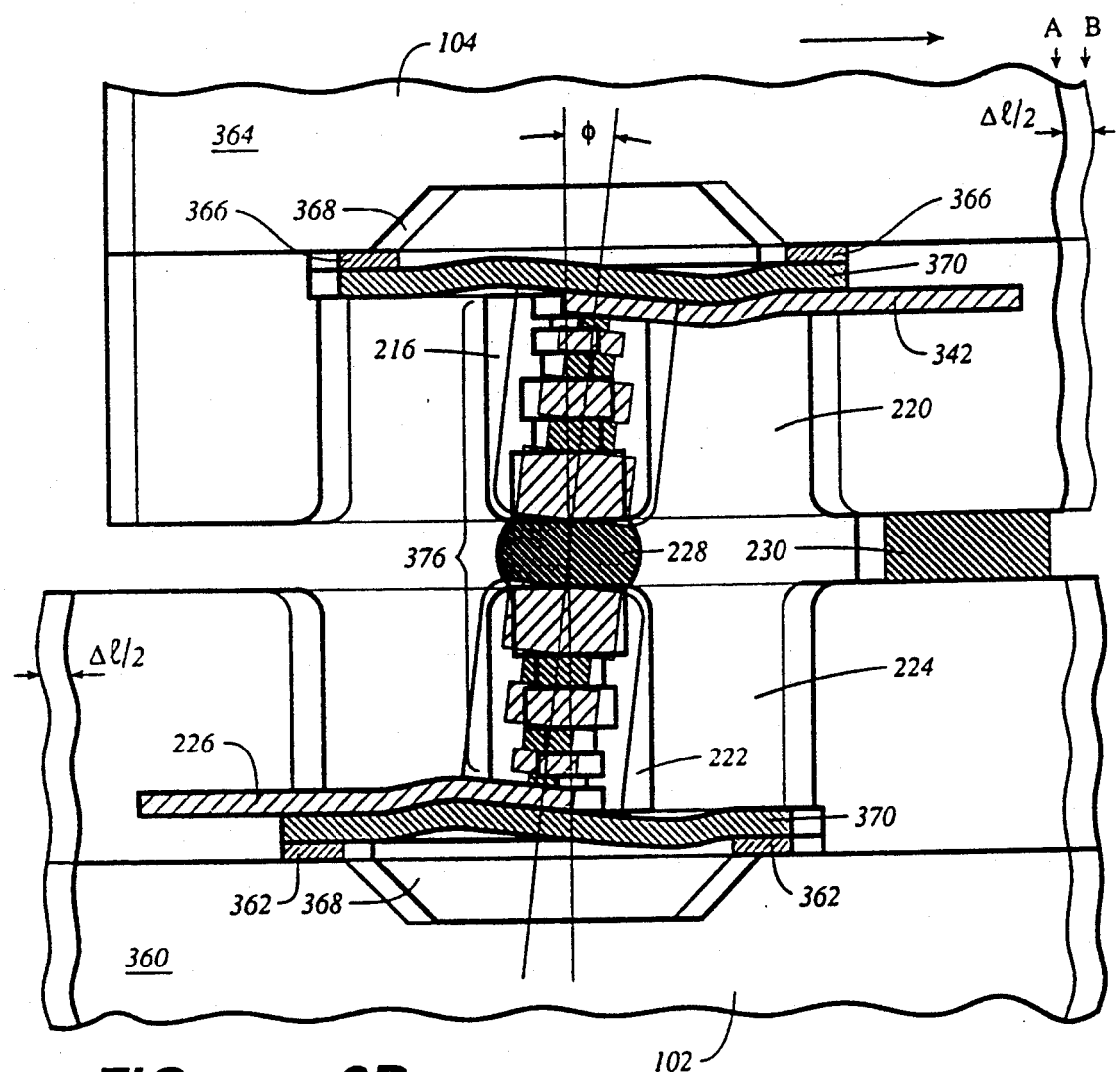
FIG. 3B is a sectional view of one of the connection pillars in FIG. 3A shown tilted as a result of differential thermal expansion.
Figure 3A:
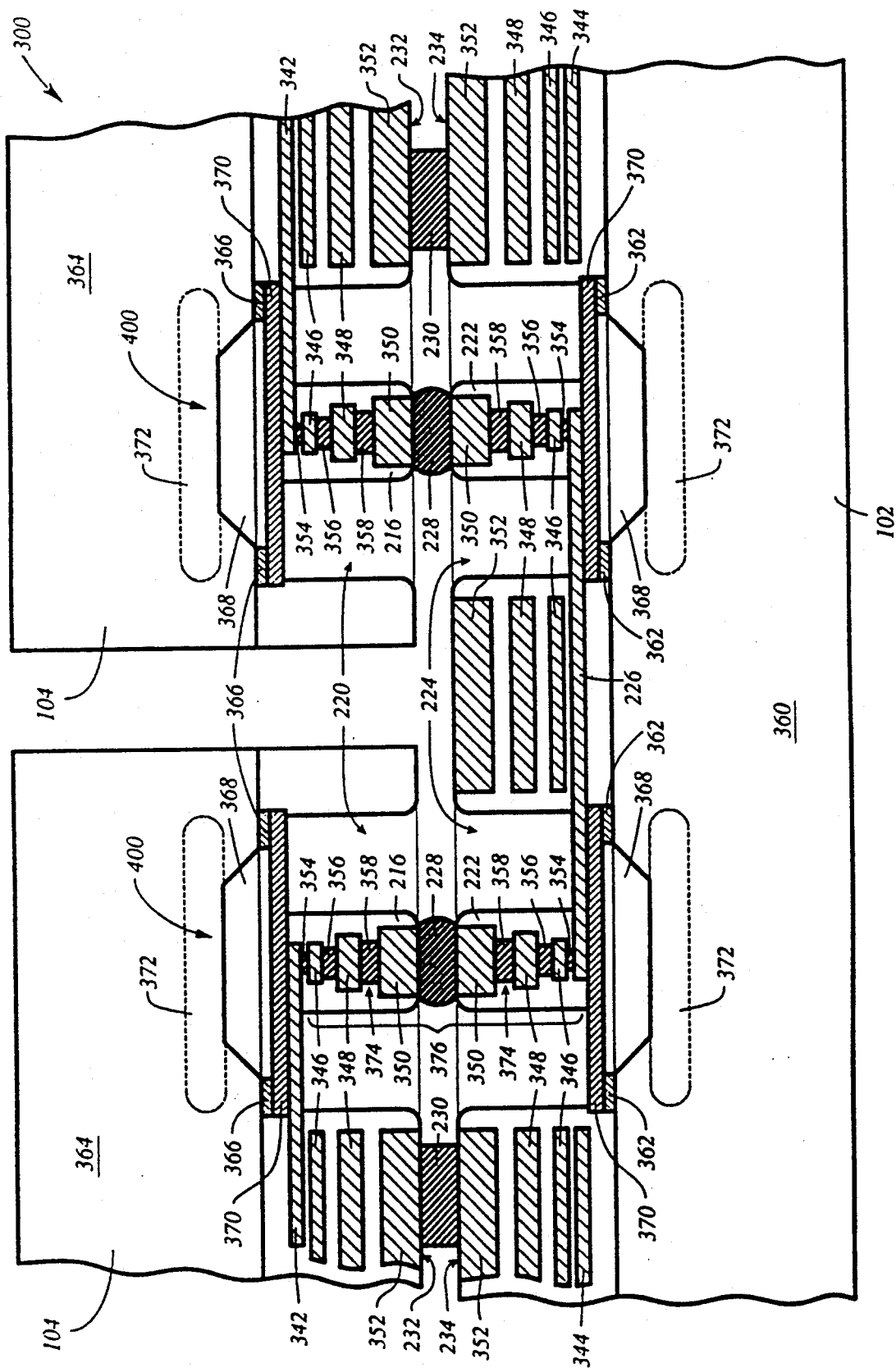
FIG. 3A is a sectional view of connection pillars and limit feet shown in FIG. 2.
Figure 4:
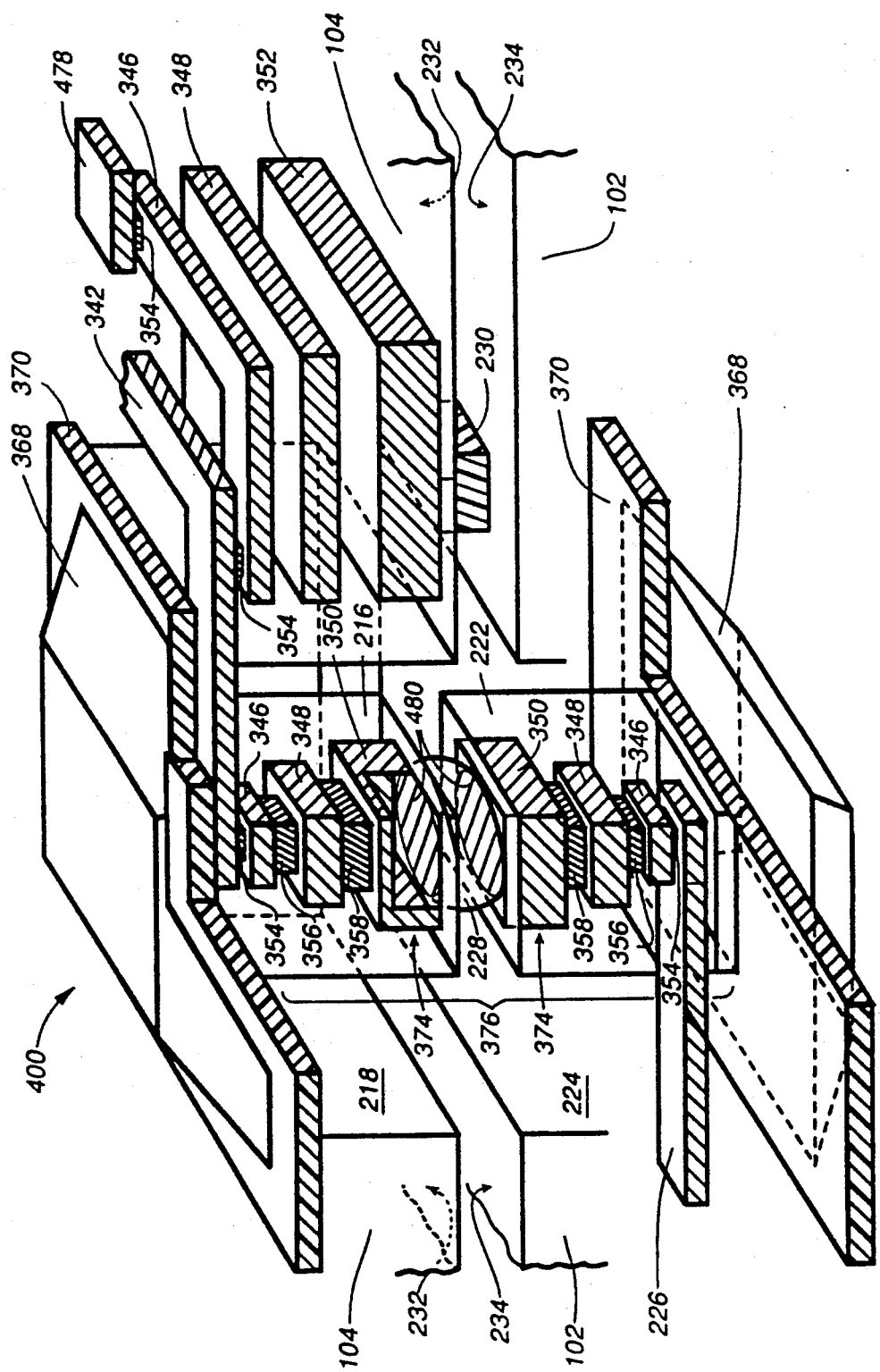
FIG. 4 is a detailed three-dimensional view of one of the connection pillars of FIG. 3A.

Carrier wafer 102 and IC dice 104 are attached using connection assemblies 400, as shown in FIGS. 3A and 4. The latter consist of connection pillars 376, containing posts 216 and 222 joined by solder bump 228, and flexible members which are comprised of cavities 368 covered by flexible silicon dioxide membranes 370. Connection posts 216 are attached to flexible membranes 370 on dice 104 and connection posts 222 attach to membranes 370 on carrier wafer 102. Each post, 216, 222 contains a conductive core 374 which is made of a multi-level interconnect structure of predefined metal islands from all metal layers used in the process. The structure of core 374 comprises metal islands 350, 348, 346 and interconnects 342, 226, as well as vias 358, 356 and 354 respectively.

Flexible membranes 370, made of silicon dioxide, are formed over cavities 368 filled with a compressible (soft) material. Cavities 368, shown in FIG. 3A, are filled with air.

Apertures 240, slots 238 and cavities 368 of wafer 102 can be formed by employing similar processes. Fabrication of apertures 240 and cavities 368 starts with growing an oxide layer 362 on substrate 360 of carrier wafer 102. Oxide is then removed from rectangular areas of carrier wafer 102 where apertures 240 and cavities 368 are to be formed, using conventional photo-lithographic techniques. Finally, a highly anisotropic etch along the $<111>$ crystallographic planes defines apertures 240 and cavities 368 within the rectangular areas. This is accomplished by dipping carrier wafer 102 into an etchant solution, containing ethylenediamine, pyrocatechol and water, named "EDP". Alternative etchants with similar properties can also be used. The $<111>$ oriented walls of apertures 240 and cavities 368 form an angle of 54.74° with the top surface of wafer 102, which is defined along the $<100>$ crystallographic plane. Etching terminates on a P+ buried layer 372, thereby creating flat bottoms of apertures 240 and cavities 368.

Slots 238 in chips 104 are formed using a similar process to the one described above. The array of chips in an integrated circuit wafer, including chips 104, are laterally separated by widened "scribe lines" to enable the formation of slots 238. Apertures are etched into the wafer across these scribe lines. After processing of the wafer is complete, it is diced so as to bisect the apertures which renders slots 238 in chips 104 and its replicas.

Pin blocks 236 are formed applying the same etching techniques used to fabricate apertures 240, cavities 368 and slots 238. A silicon wafer with top and bottom surfaces along $<100>$ crystallographic orientations is coated on both sides with silicon dioxide. Congruent arrays of oxide islands are photolithographically defined on both wafer surfaces. After removing the oxide from inter-island regions, the patterned wafer is subjected to a double sided EDP etch which creates an array of pin blocks 236. Final pin blocks 236 have residual oxide layers etched off top and bottom. Their lower and upper sidewalls along the $<111>$ crystallographic planes conform to corresponding walls of apertures 240 and slots 238.

A four-layer metal process is used to fabricate carrier wafer 102 and dice 104. Connection posts 216 and 222 are formed by etching rings 220 and 224 into the dielectric around the photolithographically predefined metal islands in dice 104 and carrier wafer 102 respectively. Etching of vacant rings 220 and 224 is stopped at the top surface of membranes 370 and first layer metal interconnects 342 and 226 respectively, so that the post-to-membrane attachment areas are clearly defined. The inner walls of vacant rings 220 and 224 become the outer walls of connection posts 216 and 222, whereas their outer walls define the holes in the active interconnection regions of dice 104 and carrier wafer 102 respectively. Dielectric wall 218, which is part of the active interconnection region of the left die 104, accentuates the residual hole remaining from the formation of connection post 216, as shown in FIGS. 2 and 4.

The connection assemblies 400, which link the chips and carrier of flip-chip assembly 300, have electrical as well as unique mechanical attributes which are discussed below.

Connection posts 216 and 222 are made of a dielectric shell and conductive core 374 to electrically link the assembly components. Each core contains a structure of metal islands and vias, as shown in FIGS. 3A and 4. The metal islands are linked in the following succession. First layer metal interconnects 342 in die 104 and 226 in carrier wafer 102 are connected to second layer metal interconnects 346 through vias 354. Second layer metal interconnects 346 are connected to third layer metal interconnects 348 through vias 356. Third layer metal interconnects 348 are connected to fourth layer metal interconnects 350 through vias 358.

A typical electrical path on chip 104, which links its active area with post 216, consists of first layer metal trace 478 and first layer metal interconnect 342 which are interconnected through second layer metal 346 and vias 354, as shown in FIG. 4.

The electrical path between adjacent dice 104 in assembly 300 consists of two first layer metal interconnects 342 and two connection pillars 376 joined by first layer metal interconnect 226. Each connection pillar 376 comprises a pair of opposing posts, 216 and 222, joined by solder bump 228. This invention takes advantage of conventional solder bump technology, which uses a 95% lead -5% tin solder composition as taught by E. Levine et al., F. Nakano et al. and H. Tong et al., cited above. Solder is initially placed on posts 222 of carrier wafer 102 by way of a dip process and subsequently attached to posts 216 of dice 104 during a one-shot reflow phase. More specifically, attachment of solder bump 228 to opposing posts 216 and 222 is due to molecular bonding between solder and metal which results in adhesion surfaces 480, as shown in FIG. 4.

Prior to the soldering phase of flip-chip assembly 300, spacing variations between upper surfaces 232 of dice 104 and upper surface 234 of carrier wafer 102 are noticed. Since contact areas of connection posts 216 and 222 are co-planar with surfaces 232 and 234 respectively, local spacings, defined by contact areas 232 and 234 of opposing posts, can vary within prospective attachment areas. These spacing variations, which need to be accommodated during assembly of chips 104 and carrier wafer 102, can be kept within tight tolerances due to the fact that integrated circuit substrates are substantially optically flat. When chips 104 and carrier wafer 102 are aligned and brought together for soldering, these tolerances produce differently shaped solder bumps 228 of varying heights across attachment areas, so that spacing variations are accommodated.

Final shapes of solder bumps 228 are created as a result of employing limit feet 230, which set the minimum spacing between chips 104 and carrier wafer 102 when the assembly is complete. The holding force of the flip-chip assembly, furnished by an assembly tool, maintains pressure of limit feet 230 against carrier surface 234 during assembly. Once solder bumps 228 have solidified quiescent conditions for connection assemblies 400 are established where membranes 370 are flat and incur minimal initial tension. In addition wafer thickness variation may need to be accommodated depending on the wafer to heatsink interface.

Limit feet 230, which are attached to chip surfaces 232 and distributed across the interconnection areas, are made of dielectric and attached to a passivation layer over fourth layer metal 352. Alternatively, limit feet 230 can be made of metal and attached to the passivation layer over the interlevel dielectric surface 232.

The dimensions for connection assembly 400, shown in FIG. 4, are as follows. Overall height of connection posts 216 and 222 is 7.8 μm, with the following breakdown:

| | | |
|---|---|---|
| First layer metal interconnect | 342/226 | 0.7 μm |
| First-to-Second metal via | 354 | 0.4 μm |
| Second layer metal interconnect | 346 | 0.7 μm |
| Second-to-Third metal via | 356 | 0.8 μm |
| Third layer metal interconnect | 348 | 1.2 μm |
| Third-to-Fourth metal via | 358 | 1.0 μm |
| Fourth layer metal interconnect | 350 | 2.0 μm |
| Passivation | | 1.0 μm |

Solder bumps 228 are 3.0 μm high. Flexible membranes 370 are 0.8 μm thick and cavities 368 are 2.4 μm deep.

The cross section of posts 222 and 216 is approximately 10.0 μm × 10.0 μm. Dimensions of corresponding vacant rings 224 and 220 respectively, shown in FIG. 3A, are 18.0 μm × 18.0 μm. These dimensions allow for a limited misalignment of opposite posts 222 and 216 in assembly 400 with a sufficiently small solder bump 228, assuming a cummulative alignment tolerance of ±1.0 μm (±2.0 μm max.) between chip 104 and carrier wafer 102.

Membranes 370 are fabricated using a unique bonding technique between oxide layers of carrier wafer 102 and a dummy wafer which is subsequently disposed of. The starting point of this process is the residual pattern of the thin silicon dioxide layer 362 which served as a mask for etching apertures 240 and cavities 368 into substrate 360 of carrier wafer 102, as discussed above. A dummy wafer covered with a silicon dioxide layer is placed over wafer 102 and bonded to it by pressing oxidized layer 362 and that of the dummy wafer together in an oxidizing atmosphere at a temperature exceeding 700° C. The substrate of the dummy wafer is then etched away leaving the new silicon dioxide layer bonded to silicon dioxide layer 362. This new layer is selectively etched, removing it from regions containing apertures 240 and circuit elements while leaving it over cavities 368. The silicon dioxide portions left over cavities 368 define flexible membranes 370.

Fabrication of membranes 370 for chips 104 is identical to the process described above. Here cavities 368, which are etched into substrate 364, and apertures 240 are defined by silicon dioxide layer 366.

An alternative fabrication method for membranes 370 in both carrier wafer 102 and chips 104 involves two L-shaped apertures formed through respective silicon dioxide layers 362 and 366 and into the silicon underneath. The L-shaped apertures define the sides of a square region where they face each other across its diagonal. Each leg of each aperture exceeds one half of the side of the square, so that the projection of a leg onto the opposite side of the square overlaps the leg located there. These overlapping features are necessary to ensure a complete etch below the square region in the subsequent processing step.

An EDP etch through the L-shaped apertures removes the silicon under the square to a depth defined by P+ layer 372, as shown in FIG. 3A. After completion of the etch the L-shaped apertures can be filled with polycrystalline silicon. The final structure comprises the square region, which defines one of the membranes 370, and the void underneath it which is the associated cavity 368.

The fabrication of membranes 370 and cavities 368 is described in U.S. patent application Ser. No. 295,729.

This invention is based on the mechanical attributes of the connection assembly 400, and more specifically, on its ability to flex when subjected to stress. Connection pillars 376, comprised of posts 222, 216 and solder bump 228, tilt through an angle $\phi$ in response to a lateral displacement $\Delta l$ caused by differential thermal expansion, as shown by the two $\Delta l/2$ displacements in FIG. 3B. The pillars can move in their axial direction as well as tilt orthogonal to it, i.e. in XY planes parallel to upper surfaces 232 and 234 of chips 104 and carrier wafer 102 respectively. This ability to move, predicated on the flexibility of membranes 370, relieves flip-chip assembly 300 of the shear strain experienced in its conventional rigid counterparts during differential thermal expansion. Alleviation of shear strain practically eliminates solder bump failures, and thereby yields significantly more reliable flip-chip assemblies.

FIG. 3B is a simplified representation of the response of connection pillar 376 to differential thermal expansion. It is shown as a rotation of the pillar axis about a stationary center, while displacement $\Delta l$ is illustrated as two partial displacements $\Delta l/2$ of chip and carrier in opposite directions. Assuming that the temperature of chip 104 rises with respect to that of carrier wafer 102, $\Delta l$ is defined as the maximum obtainable displacement across the chip for a temperature difference of $\Delta T = 50°$ C.

When quiescent conditions exist, chips 104 and carrier wafer 102 have equal temperatures and membranes 370 are flat with minimal internal tension. During operation of chips 104 their temperatures rise above that of carrier wafer 102 effecting differential thermal expansion between them. As a result, first layer metal interconnect 342, which is the bottom of post 216 in chip 104, pulls connection pillar 376 into a tilting position enabled by the flexibility of membranes 370. The tilting of connection pillar 376 applies tension to membranes 370 of chip 104 and carrier wafer 102, resulting in their deformation and compression of the air inside cavities 368.

Displacement $\Delta l$ caused by differential thermal expansion is proportional to the chip area and the temperature difference $\Delta T$ between chip 104 and carrier wafer 102. Assuming a chip area of approximately 10.0 mm $\times$ 10.0 mm and a temperature difference of $\Delta T = 50°$ C., a displacement of $\Delta l = 0.86$ $\mu$m is obtained. If the height of connection pillar 376 is designated "h" then based on the dimensions listed above $h = 2 \times 7.8 + 3.0 = 18.6$ $\mu$m, yielding a ratio of $\Delta l/h = 4.6\%$. This "tilting ratio", which allows to determine the lateral force acting on connection pillar 376, is reasonably small.

Figure 5:
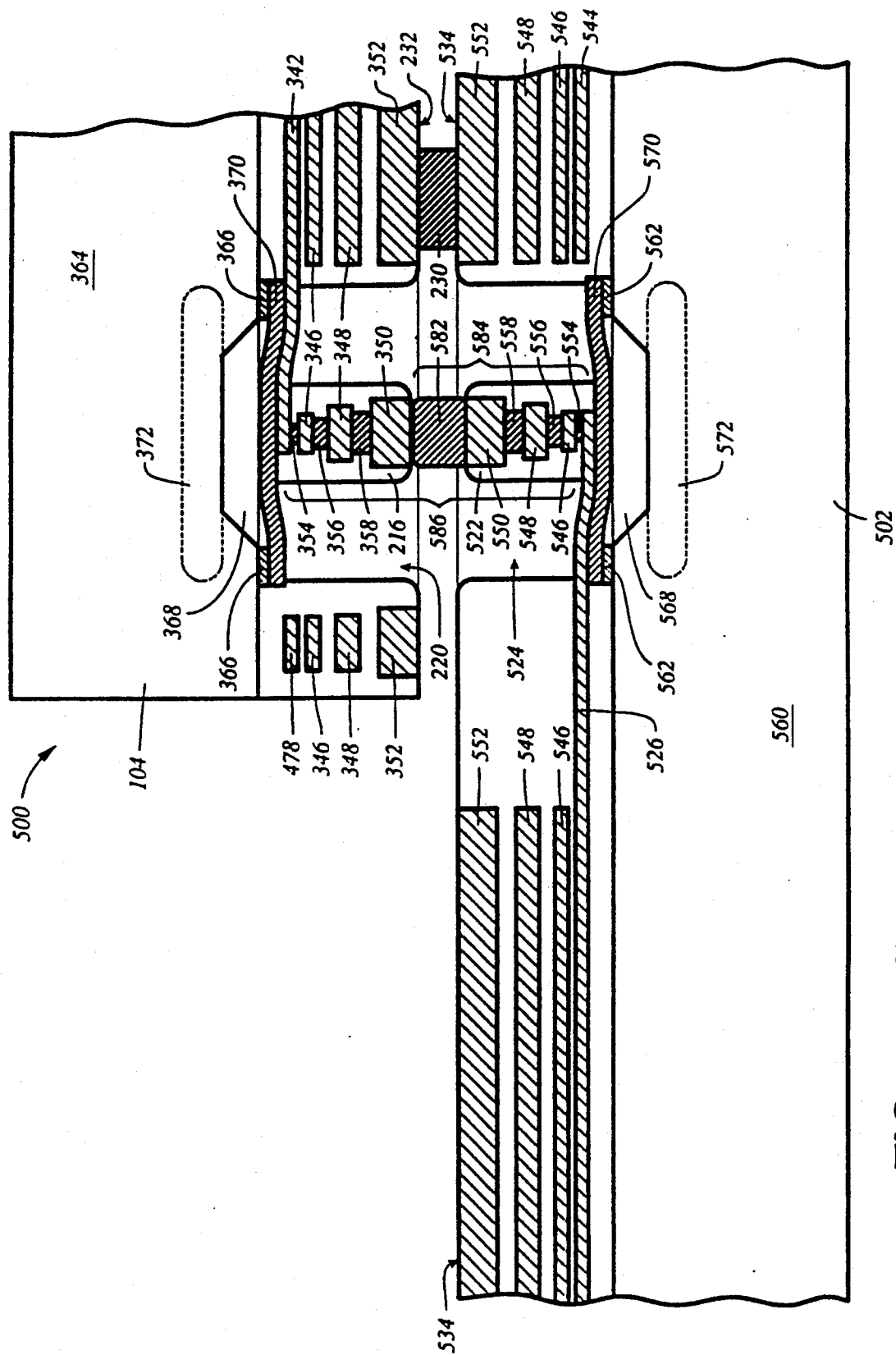
FIG. 5 is a sectional view of a "membrane prober" assembly in accordance with the present invention.

Testing of flip-chip assembly 300 and its individual components is accomplished by using membrane prober assembly 500, as shown in FIG. 5. It differs from flip-chip assembly 300 by employing metal bumps 582 in place of solder bumps 228. Metal bumps 582, attached to posts 522 of test carrier wafer 502, are directly deposited on fourth layer metal islands 550 to become an integral part of "test posts" 584. Construction and fabrication of posts 522 and the flexible members of test carrier wafer 502 are identical to their counterparts in flip-chip assembly 300, as described above. Post 522 contains a conductive structure surrounded by a dielectric shell. The conductive structure comprises metal islands 550, 548, 546 and first layer metal lead 526 interconnected by vias 558, 556 and 554 respectively. Flexible members of carrier wafer 502 consist of membranes 570 formed over cavities 568 which are etched into substrate 560 down to P+ buried layers 572. Oxide layer 562 of wafer 502 is left from the fabrication of membranes 570.

The height of metal bumps 582 exceeds that of limit feet 230 by about 1.0 $\mu$m to 2.0 $\mu$m to accommodate spacing variations of opposing posts 522 and 216 across the attachment area during closure of the test assembly. Test posts 584 of test carrier wafer 502 and posts 216 of chips 104 are attached to respective membranes 570 and 370, which will yield to compensate for vertical spacing variations between opposing posts. The force deflecting membranes 570 and 370 is applied by a clamp pressing on chips 104 when the test jig housing assembly 500 is closed. Limit feet 230, define the minimum spacing between chips 104 and carrier wafer 502, thereby setting the depressions of membranes 570 and 370 respectively.

During differential thermal expansion between chip and carrier of assembly 500, post 216 can move with respect to test post 584, causing it to slide at their interface (350, 582). Furthermore, test pillar 586 can tilt due to the flexibility of membranes 570 and 370.

A typical electrical path through test assembly 500 contains first layer metal interconnect 342 of die 104 connected to first layer metal interconnect 526 of carrier wafer 502 via test pillar 586. Terminals of test carrier wafer 502 are attached to upper conductive surfaces 534 of interconnect metal structures made of layers 552, 548, 546 and 526.

Membrane prober 500 can be used for testing a complete assembly configuration 300, or alternatively, individual chips 104. Separate carrier wafers 502, uniquely wired for each test configuration, can be used. Terminals of respective test carrier wafers 502 are then wire bonded to conductors of ceramic housings, like 108 shown in FIG. 1, which are part of test jigs accommodating test assemblies 500. These conductors are connected to the pins of the final test packages (test jigs), which are either interfaced with a tester or serve as a "system emulator" depending on the test methodology used as described below.

Two test methodologies can be used employing the preferred test assembly 500, shown in FIG. 5. A conventional test method takes advantage of interfacing membrane prober 500 with a tester to perform vector testing of individual chips or complete assemblies. Alternatively, a particularly important test method utilizes the assembly as a "system emulator" for testing individual production chips. This "in-system" test method has the significant advantage of providing a test environment that accurately represents the full system, and saves the ever increasing costs of test development and associated hardware required for testing of complex systems in the conventional way.

The "in-system" test method avoids the many drawbacks experienced with conventional testing of an assembly on a tester. For example, large power transistors required to drive low impedance transmission lines, connecting chip and tester, are no longer required. Instead of testing the chip with test-vectors supplied by a tester, "structured testing" can be performed by means of the natural environment of the product system, as presented to the chip through the carrier wafer, using as an option special built-in circuits to speed up test coverage.

This testing can be performed on unpackaged chips taken directly from the wafer without screening tests, if desired, and without having to commit a costly package to an untested part. Besides reducing the loading from the 50 ohm inputs of the tester, the test points, as well as connection posts not used for testing, can be made with greatly reduced parasitic capacitance compared to conventional bonding pads. Further reduction in parasitics are realized since the electrostatic discharge (ESD) protection circuits can be eliminated from the chips and, alternatively, mounted onto the test and product assemblies in the factory where proper humidity control and handling practices can be enforced.

Due to the low overhead in parasitics, the connection posts present the equivalent of an "on-chip" path to the carrier wafer and thereby to another chip in the assembly. It is thus also feasible to use the interconnect levels provided by the carrier wafer as an addition to the "on-chip" interconnects. This degree of freedom is not available to any test methodology that cannot provide a perfect mating between chip and carrier because the chip in that case has incomplete circuits on it that cannot function without the carrier.

A prime advantage of the present invention, as discussed above, is the combination of conventional solder bump technology with a flexible attachment method in flip-chip assemblies. During differential thermal expansion between chip and carrier such assemblies are relieved of shear strain compared to conventional rigid structures where it causes solder joints to fail. The strain relief, provided by the present invention, yields significantly more reliable assemblies and at the same time the advantages of the one shot solder connection process are retained. The flexible attachment between chips 104 and carrier wafer 102 is realized by membranes 370 and air-filled cavities 368.

A second advantage lies in the fabrication process of connection posts 216 and 222, which is an integral part of the process used to make IC die 104 and IC carrier wafer 102, respectively. As a result the attachment method of the present invention requires minimal process overhead unlike others where special connectors, such as gold bumps, are used.

A third advantage is the adaptability of the new attachement method to multi-level interconnect structures and the simultaneous realization of a small characteristic pitch of an equally spaced succession of connection pillars 376 without dielectric partitions. A pitch of 14.0 μm or better can be obtained depending on the chip-to-carrier alignment tolerance.

A fourth advantage of the present invention is the inherent capability of devising test methods compatible with the new attachment method. This is realized by membrane prober 500 which employs test metal bumps 582 for probing in place of solder bumps 228. This membrane prober assembly can be configured for testing a complete assembly, such as 300, and alternatively, individual chips 104. For conventional vector testing the prober assembly is interfaced with a tester, however it can also be utilized as a "system emulator" for testing individual production chips. This "in-system" test capability is of particular importance since it dispenses with the many technical drawbacks and high costs associated with conventional vector testing.

The present invention provides for numerous variations to the preferred embodiments described above. The crystallographic planes chosen for wafer and chip surfaces as well as alignment structures can be varied. The procedures for forming alignment structures can be varied to accommodate the selected crystallographic planes. For example, an alternative etchant to EDP can be used to form walls along chosen planes.

In the preferred embodiment, shown in FIG. 2, apertures are formed in the wafer and slots in the die. Alternative arrangements are usable. For example, apertures can be formed in IC die 104 in place of the slots. Furthermore, protruding structures can be formed in either die or wafer to mate with corresponding recessive features in the mating component. For example, a wafer can be masked and selectively etched to leave protruding elements which allow alignment with slots in the die. Such an embodiment does not require pin blocks. In the embodiments using pin blocks, it is not necessary that they conform closely with the walls of apertures and slots. As an example, micro-spheres (of alumina or latex) can serve as pin blocks.

Different options for fabrication of cavities and membranes can be used. Cavities need not be formed concurrently with the apertures nor use a similar process. For example, cavities can be formed by etching through the substrate from the backside. They can be filled with an alternative compressible material, such as polyimide, in place of air. Flexible membranes can be shaped as bridges or cantilevers rather than cover the cavities completely, as illustrated in the preferred embodiment. Bridges can be formed by using a pair of cantilevers or by patterning a membrane with the L-shaped aperture technique proposed before in the preferred embodiment. Formation of cantilevered micro-contacts is well-established.

The present invention provides for many alternatives to the embodiments of connection pillar assemblies 400 shown in FIGS. 3A and 4. These are discussed below.

A conductive pillar, flexibly attached to both chip and carrier, can provide an alternative attachment method to the preferred method described above. The flexible attachment means can include any mechanical structure, flexible material or both, which at the same time provide electrical connections between chip and carrier. A variation to the attachment method described above, uses a pillar flexibly attached to at least one assembly component, i.e. either chip or carrier. Attachment at the other end may or may not be flexible. When one end is flexibly attached, the pillar itself is preferably flexible. Specifically, the flexible attachment in such an arrangement can be realized by a membrane placed on a cavity as described in the preferred embodiment above. Additionally, this "one-sided flexible" attachment method can use a pillar containing two posts joined by solder, as described in the preferred arrangement.

Contact surfaces of connection posts need not be co-planar with the active regions of die and wafer as in the preferred embodiment above. In fact, protruding posts can be fabricated in either assembly component, such as test posts 584 of membrane prober assembly 500, shown in FIG. 5, and used for alternative connection techniques. Furthermore, cross sections of connection posts, which are preferably layed out as squares, can also be patterned rectangular or have any other advantageous shape achievable with conventional processing.

In the preferred embodiments "stand alone" connection posts separated by dielectric walls are shown. They can be located anywhere on the chips or carrier wafer. A variation of this case is a succession of equally spaced connection posts without dielectric partitions, which is normally used for input/output circuit terminals around the periphery of a chip. Minimum spacing (and pitch)

between adjacent posts is limited by the chip-to-carrier alignment tolerance and adjusted to easily accommodate the small lateral mismatch between opposing posts. Fabrication of a succession of posts requires etching a multiple-vacant "ring chain" into the silicon component in place of the single vacant rings which form separate posts.

Limit feet need not be attached exclusively to the chips. They can be formed on carriers as well. Furthermore, limit feet can be made of oxide instead of metal used in the preferred embodiment described above. Solder composition can differ from the one used in the preferred connection pillars 376.

This invention is not restricted by the number of interconnect layers used in the IC process of the assembly components 104 and 102. Even though four layers of metal are employed in the preferred embodiment, this number can exceed or be less than four.

In the illustrated embodiment, shown in FIG. 3A, two chips are attached to a single carrier wafer. Obviously, either one or more than two chips can be placed on a single wafer. Furthermore, the chips do not have to represent the same technology, i.e. the IC package can advantageously contain mixed technologies. Specifically, Bipolar drivers in CMOS avoid BiCMOS cost. Using GaAs or other compound semiconductor chips is another example. Furthermore, optical interface driver/receiver chips for high speed communication to another carrier can also be incorporated. Another variation is obtained by mating two chips to yield a flip-chip assembly. These and other variations upon and modifications to the described embodiments are provided for by the present invention, the scope of which is limited only by the following claims.

What is claimed is:

1. An integrated circuit assembly comprising:
   an integrated circuit carrier;
   at least one integrated circuit chip in a flip-clip arrangement relative to said carrier;
   a connection pillar comprising a first post attached to said carrier, a second post attached to said chip, and a solder bump attaching said first and second posts, the pillar electrically and mechanically connecting said carrier and said chip, said connection pillar having an axis defining an axial direction, said pillar spacing, said chip and said carrier in said axial direction;
   a flexible attachment means for attaching said pillar to at least one element of the set consisting of said carrier and said chip so that said pillar can move in said axial direction and tilt with respect to said axial direction;
   said flexible attachment means including a cavity formed in said element and a flexible membrane formed over said cavity and attaching to said pillar; and
   whereby, when said carrier and said chip undergo differential thermal expansion, said pillar moves to reduce shear strain in planes orthogonal to said axial direction along said pillar; and
   said flexible attachment means includes a cavity formed in said element and a flexible membrane formed over said cavity and attaching to said pillar.

2. An integrated circuit assembly comprising:
   an integrated circuit carrier having an electrical connection point and a mechanical connection means associated with the connection point;
   an integrated circuit chip in a flip-chip arrangement with the carrier, the chip having an electrical connection point and a mechanical connection means associated with the connection point;
   an electrically conductive connection pillar mechanically connected to both mechanical connection means and in electrical contact with both electrical connection points and defining an electrically conductive path therebetween,
   wherein at least one of the mechanical connection means comprises a flexible mechanical connection with the connection pillar such that the chip is free to move relative to the carrier without disrupting the electrically conductive path; and
   the flexible mechanical connection comprises a flexible membrane.

3. An assembly according to claim 2 wherein the membrane is formed over a cavity.

* * * * *